(12) United States Patent
Monti Di Sopra et al.

(10) Patent No.: US 7,848,371 B2
(45) Date of Patent: Dec. 7, 2010

(54) LASER DEVICE FORMED BY A STACK OF LASER DIODES

(75) Inventors: Fabrice Monti Di Sopra, Thun (CH); Bruno Frei, Thierachern (CH)

(73) Assignee: Lasag A.G., Thun (CH)

( * ) Notice: Subject to any disclaimer, the term of this patent is extended or adjusted under 35 U.S.C. 154(b) by 145 days.

(21) Appl. No.: 11/914,341

(22) PCT Filed: May 10, 2006

(86) PCT No.: PCT/EP2006/004390

§ 371 (c)(1),
(2), (4) Date: Aug. 12, 2008

(87) PCT Pub. No.: WO2006/122692

PCT Pub. Date: Nov. 23, 2006

(65) Prior Publication Data

US 2008/0310469 A1 Dec. 18, 2008

(30) Foreign Application Priority Data

May 13, 2005 (EP) .................................. 05010406

(51) Int. Cl.
*H01S 3/04* (2006.01)
(52) U.S. Cl. .................. 372/36; 372/34; 372/45.01; 372/46.01; 372/50.12; 372/50.122; 372/68
(58) Field of Classification Search ............ 372/34, 372/36, 50.12, 45.01, 46.01, 50.122, 68
See application file for complete search history.

(56) References Cited

U.S. PATENT DOCUMENTS 5,099,488 A * 3/1992 Ahrabi et al. ............... 372/36

(Continued)

FOREIGN PATENT DOCUMENTS

EP 0 805 527 A2 11/1997

OTHER PUBLICATIONS

Endriz, Jon G., et al., "High Power Diode Laser Arrays," IEEE Journal of Quantum Electronics, Apr. 28, 1992, No. 4, pp. 952-964.

(Continued)

*Primary Examiner*—Minsun Harvey
*Assistant Examiner*—Yuanda Zhang
(74) *Attorney, Agent, or Firm*—Griffin & Szipl, P.C.

(57) ABSTRACT

The laser device (22) is formed by a stack of laser diodes (4) arranged on plates (6) formed of a material that is electrically conductive and a good heat conductor. In order to obtain a high level of heat evacuation efficiency towards the cooling body (10) and to prevent electric short-circuiting problems, each plate has at the bottom end (24) thereof, an electrically insulating layer deposited on the surface thereof prior to being fixed to the cooling body by a securing material (26) that is preferably a good heat conductor, formed in particular by a braze layer. According to the invention, the insulating layer covers the end face of each plate and also goes up along the lateral faces of the latter over a certain height. The securing material is arranged under the end of the plate and also partially covers the insulating layer along the lateral faces of the plate.

7 Claims, 3 Drawing Sheets

U.S. PATENT DOCUMENTS

| | | | | |
|---|---|---|---|---|
| 5,305,344 A | * | 4/1994 | Patel | 372/50.12 |
| 5,394,426 A | | 2/1995 | Joslin | |
| 5,764,675 A | * | 6/1998 | Juhala | 372/50.1 |
| 5,848,083 A | * | 12/1998 | Haden et al. | 372/36 |
| 5,898,211 A | * | 4/1999 | Marshall et al. | 257/601 |
| 5,923,692 A | * | 7/1999 | Staskus et al. | 372/50.12 |
| 5,985,684 A | * | 11/1999 | Marshall et al. | 438/26 |
| 6,101,206 A | * | 8/2000 | Apollonov et al. | 372/50.12 |
| 6,636,538 B1 | * | 10/2003 | Stephens | 372/36 |
| 6,700,913 B2 | * | 3/2004 | Pinneo et al. | 372/43.01 |
| 2004/0082112 A1 | | 4/2004 | Stephens | |

OTHER PUBLICATIONS

International Search Report issued in corresponding application No. PCT/EP2006/004389, completed Jan. 31, 2007 and mailed Feb. 15, 2007.

* cited by examiner

LASER DEVICE FORMED BY A STACK OF LASER DIODES

This is a National Phase Application in the United States of International Patent Application No. PCT/EP2006/004390 filed May 10, 2006, which claims priority on European Patent Application No. 05010406.6, filed May 13, 2005. The entire disclosures of the above patent applications are hereby incorporated by reference.

FIELD OF THE INVENTION

The invention concerns a laser device formed by a stack of laser diodes each arranged on a plate formed of a material that is electrically conductive and a good heat conductor. These plates, on the one hand, ensure an electrical connection between the laser diodes allowing the passage of an electrical supply current, and on the other hand, allow the heat generated by the laser diodes to be conducted in the direction of a cooling body, which then evacuates or dissipates the heat from the laser diodes.

In particular, the invention concerns a stack of quasi-continuous or continuous light wave laser diodes (QCW or CW laser diode).

BACKGROUND OF THE INVENTION

FIG. 1 shows partially a laser diode of the aforementioned type. This device 2 includes laser diodes 4 in the form of bars, schematically shown, and metal plates 6 between which the laser diodes are arranged. In order to power the laser diodes, plates 6 are electrically conductive. The electrical connection between plates 6 and laser diodes 4 is achieved in a manner known to those skilled in the art. In order to protect the laser diode itself, the latter can be associated with an electrically insulating bottom part of greater thickness than the material forming the laser diode. In the Figures annexed to the description of the present invention, the various elements or layers associated with a laser diode are represented schematically with the latter in the form of a bar 4.

The arrangement of plates 6 and the laser diodes thus allows an electrical current to pass along direction X. Some heat transmission is also obtained along this direction X via metal plates 6. In particular, plates 6 are made of copper. However, to allow efficient cooling, the heat generated by the diodes must be able to be evacuated by plates 6 in the direction of cooling body 10. This cooling body has, in a conventional manner, a conduit 12 for a water flow. Since the electrical current has to pass through the diodes along direction X, plates 6 must be electrically insulated from each other. In order to do this, in the prior art of FIG. 1, an electrically insulating ceramic layer 14 is welded to body 10 via a braze forming a film 16. Next, each plate 6 is welded to the layer 14 again using a braze 18. Plates 6 must be welded in a structured manner, to prevent any short-circuits between plates 6. One must therefore prevent the braze between a plate 6 and ceramic layer 14 being in contact with the braze used for welding another plate.

The device of the prior art described here has several drawbacks. First of all, making a structured weld for securing the plates to the insulating layer is a complex operation requiring particular precautions. Moreover, it is difficult to guarantee a good industrial yield for this operation given that braze 18 tends to stretch during welding. It will also be noted that a weld defines an interface that forms a brake on the heat transfer towards cooling body 10. In the case of FIG. 1, two layers of weld are present on either side of layer 14, which decreases the cooling efficiency of the laser diodes.

There is also known from US Patent No. 2004/0082112, a stack of laser diodes that differs from that shown in FIG. 1 essentially in that the insulating layer is structured. According to the teaching of this document, each plate is assembled in the bottom part thereof to an electrically insulating layer by a weld. This insulating layer is flat and has the same dimensions as those of the end of the plate. Each plate is thus first of all welded to its own insulating layer. Next, each assembly thereby formed is welded to the cooling body by means of a braze, affixed to the cooling body and structured so as to correspond to the distinct zones provided for the plurality of "plate-insulating layer" assemblies.

This latter embodiment of the prior art, just like that shown in FIG. 1, raises manufacturing problems. The structured weld defines a precise location for each plate on the cooling body. This raises a problem for machining the various elements, in particular a tolerances problem as to the plate thickness and the diode thickness. Indeed, variations in these thicknesses also cause an alignment problem of the diode and plate stack with the braze zones. Decreasing the tolerances in machining the plates and diodes increases the manufacturing cost. Moreover, the thickness of the diodes can vary substantially within the standard assortment of a laser diode manufacturer. It should also be noted that this thickness is not standardised such that it also varies from one supplier to another. A method such as that disclosed in US Patent No. 2004/0082112 thus raises a real assembly problem. Another problem arises from the fact that the height of the structured braze layer has to be low to remain substantially within the distinct zones provided. Thus, the plate height machining tolerance is also critical. If, during the prior assembly of the plate and laser diode stack, the bottom ends of the plates are arranged in the same geometrical plane to ensure that each plate will sit properly on the braze arranged in the corresponding zone on the cooling body when the plates are welded thereto, the laser diodes secured to the plates on the top end side thereof will not emit within the same emission plane, which raises a problem of collimation or focussing the laser beam generated by the plurality of diodes.

It is an object of the present invention to overcome the aforementioned problems by proposing a laser device with a stack of laser diodes that can be manufactured by a reliable industrial method the implementation of which is relatively easy. It is another object of the invention to propose a laser device of this type arranged so as to evacuate efficiently the heat generated by the laser diodes.

SUMMARY OF THE INVENTION

The present invention therefore concerns a laser device formed by a stack of laser diodes each arranged between two plates formed of a material that is electrically conductive and a good heat conductor, each plate being provided, at the end thereof next to a cooling body to which it is secured by a securing material, with an electrically insulating layer forming an interface between, on the one hand, the cooling body and the securing material, and, on the other hand, the plate. The laser device is characterized in that the electrically insulating layer covers the bottom face of said end and goes substantially as far as a certain height along the lateral faces of the plate, said securing material covering the insulating layer on the side of said bottom face and also along said lateral faces without going beyond the height of the electrically insulating layer.

According to a preferred embodiment, the material securing the plates to the cooling body defines a substantially continuous layer between the plates with a thickness that is greater than the distance separating the bottom faces of the plates and the cooling body. Since the lateral faces are covered in the bottom part thereof to a first height by the insulating material, the securing material can move up along these lateral faces substantially as far as a second height lower than said first height, without any risk of electrical short circuit.

BRIEF DESCRIPTION OF THE DRAWINGS

The invention will be described hereinafter via the following description, made with reference to the annexed drawing, given by way of non-limiting example, and in which.

DETAILED DESCRIPTION OF THE ILLUSTRATIVE EMBODIMENTS

Figure 1:
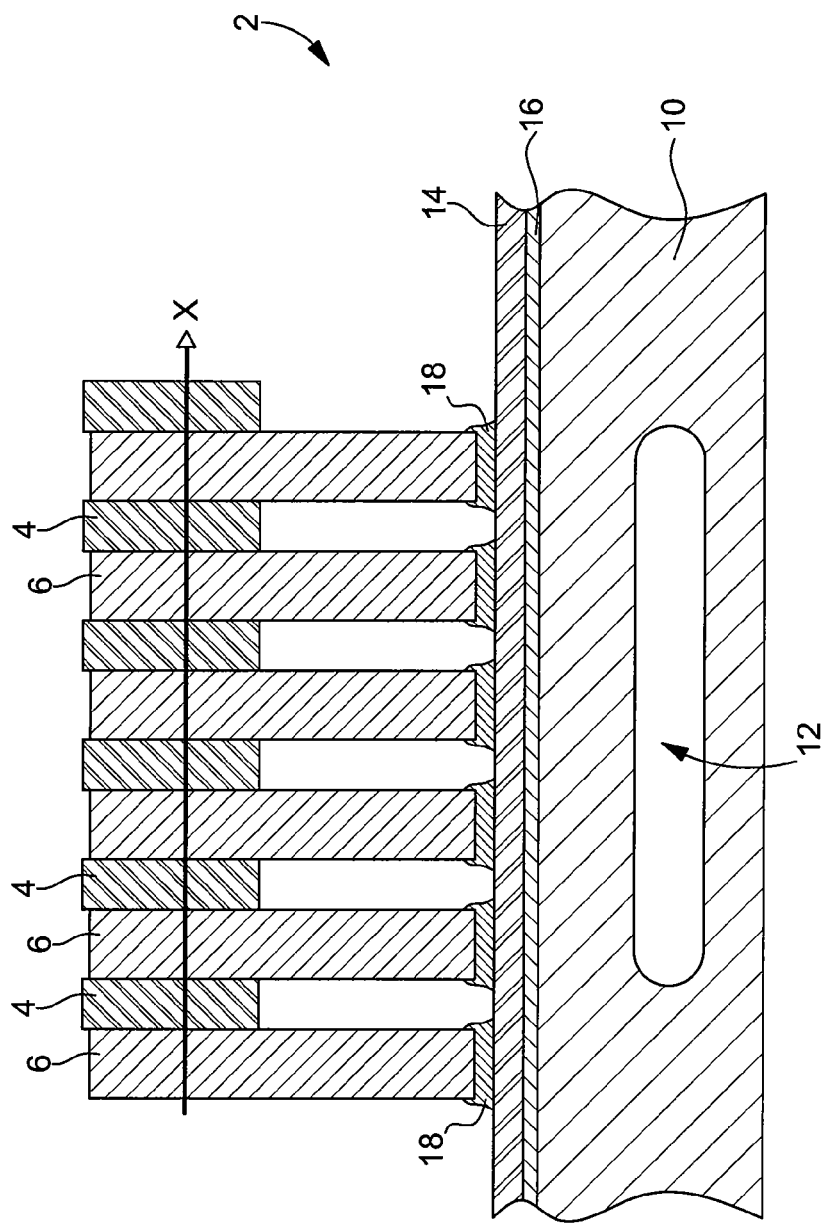
FIG. 1, already described, shows schematically a laser device with a stack of laser diodes according to the prior art.
Figure 2:
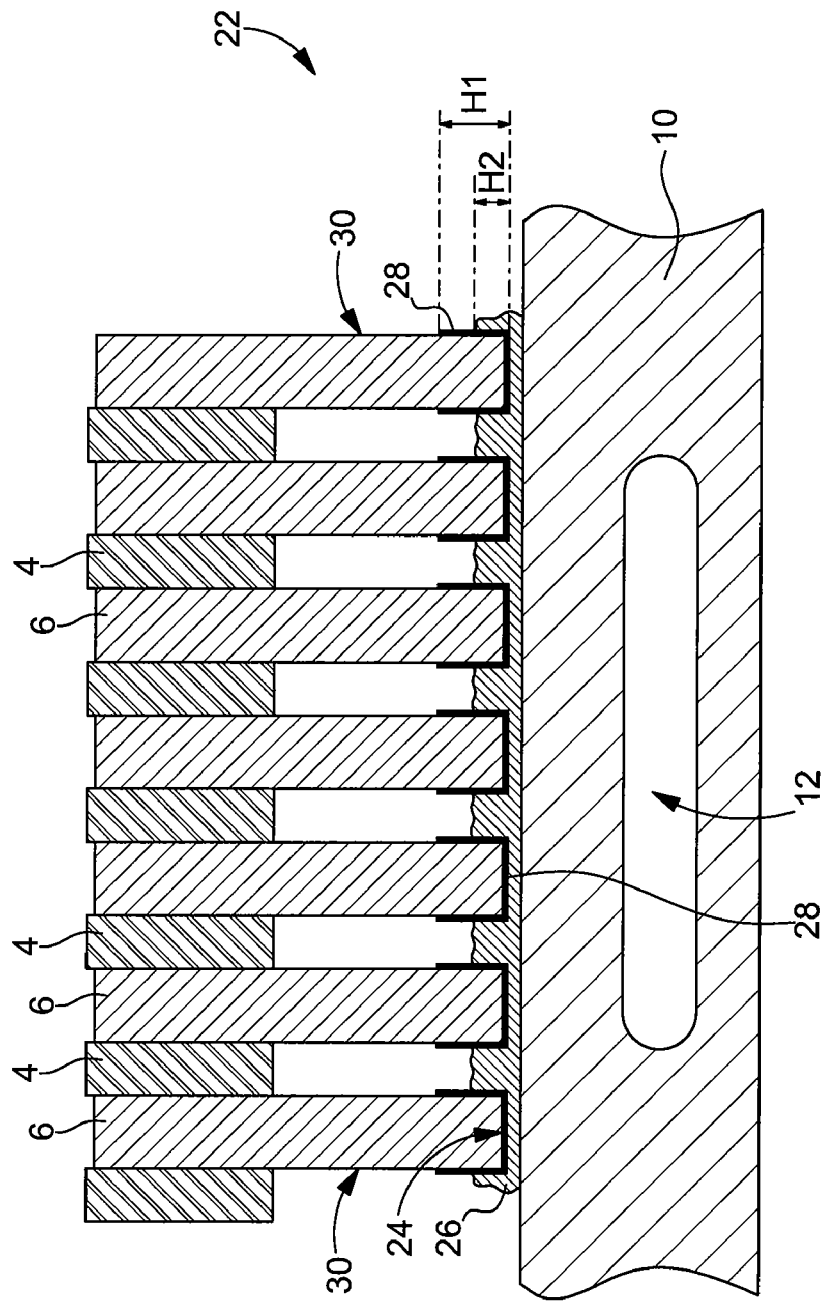
FIG. 2 shows schematically one embodiment of the present invention.

FIG. 2 shows a preferred embodiment of the invention. The laser device 22 includes, as in the prior art, plates 6 formed of a material that is electrically conductive and a good heat conductor. In a similar manner to the prior art, laser diodes 4 are arranged between plates 6 so as to allow the passage of an electric supply current for the diodes. The number of diodes and plates may vary, particularly as a function of the intended application of the laser devices. Plates 6 can be entirely made of metal or another surface metallised material.

Plates 6 are arranged above a cooling body 10 that has a duct or conduit 12 for the flow of a cooling fluid. Plates 6 and cooling body 10 are made for example of copper. Other materials that are good heat conductors could of course also be envisaged. Preferably, plates 6 are formed of an electrically conductive material with good heat conductivity to allow the heat generated by the laser diodes to be evacuated in the direction of cooling body 10. The plates are secured at the bottom end thereof to cooling body 10 by means of a securing material 26 selected so as to convey sufficient heat. In this embodiment, securing material 26 is also an electric conductor.

Each plate 6 has at the bottom end thereof, i.e., the end secured to cooling body 10, an electrically insulating layer 28, which is arranged to form an interface between, on the one hand, cooling body 10 and securing material 26 and, on the other hand, the plate 6 concerned.

Insulating layer 28 is a thin layer that covers the bottom face 24 of the plate and which reaches a first height H1 along the lateral faces 30 of each plate 6. Securing material 26, particularly a braze, covers insulating layer 28 on the side of bottom face 24 of the plate and also along the lateral faces 30 thereof substantially over a second height H2, which is lower than first height H1. Obviously, height H2 may vary depending upon the location and may be higher or lower along the bottom parts of plates 6.

Owing to the features of the invention, securing material 26 may form a relatively thick transverse or through layer. Thus, a braze can be deposited, necessary for welding the plates to the cooling body so as to form a continuous layer, i.e. a non structured layer, and the plates are then added in order to be welded. One could also envisage adding braze 26 once plates 6 have been arranged opposite body 10. All of the welding methods known to those skilled in the art are available for optimising the method of securing plates 6 to body 10.

The fact that the bottom parts of plates 6 are immersed in braze layer 26 to a certain height increases the heat transfer surface between each plate and the braze layer, which increases the efficiency of the heat transfer from plates 6 to braze 26, then to cooling body 10 on which the braze layer is deposited. Since insulating layer 26 is relatively thin and particularly made of ceramic material or on synthetic diamond, the heat conduction from the diodes to the cooling body is optimised. Moreover, the device of FIG. 2 requires a single weld between plates 6 and body 10. Indeed, thin layer 28 could be deposited by various techniques known to those skilled in the art, other than braze welding.

A few methods for depositing the electrically insulating layer 28 on the bottom parts of plates 6 will be described below in a non-limiting manner. The deposition of such a layer can be obtained, according to a first alternative implementation, by a dipping method wherein the bottom parts of the plates are dipped in a bath so as to obtain surface coating. In particular, a sol-gel technique is used here for depositing ceramic type coatings. The layer thereby obtained has relatively good heat conductivity and good electrical insulation. Those skilled in the art are aware of other conventional techniques for obtaining a layer covering the bottom part of plates 6. In particular, those skilled in the art know the use of a spray for depositing a layer or the centrifugal technique. Layers with a thickness varying between approximately two microns and thirty microns can thus be obtained. The thickness of the electrically insulating layer is determined in particular by its capacity to preserve a given potential drop, for example approximately of twenty volts. It will be noted that the plate can have one or several external layers, in particular a nickel layer of approximately three microns and a superficial gold layer of approximately one tenth of a micron.

Another alternative implementation of the thin layer deposition method is the use of vapour phase deposition technology. Those skilled in the art know in particular physical (PVD) or chemical (CVD) type vapour phase deposition. Cathodic sputtering or ion plating will be mentioned by way of PVD deposition examples. With such techniques, thin layers of several microns can be obtained. Using a PVD technique, ceramic oxide (for example AlOx) or nitride (AlN) type layers can be deposited, and synthetic diamond layers (DLC). These layers are operational with a thickness of only 1 to 5 microns.

A thin layer can also be deposited by an evaporation under vacuum technique.

Figure 3:
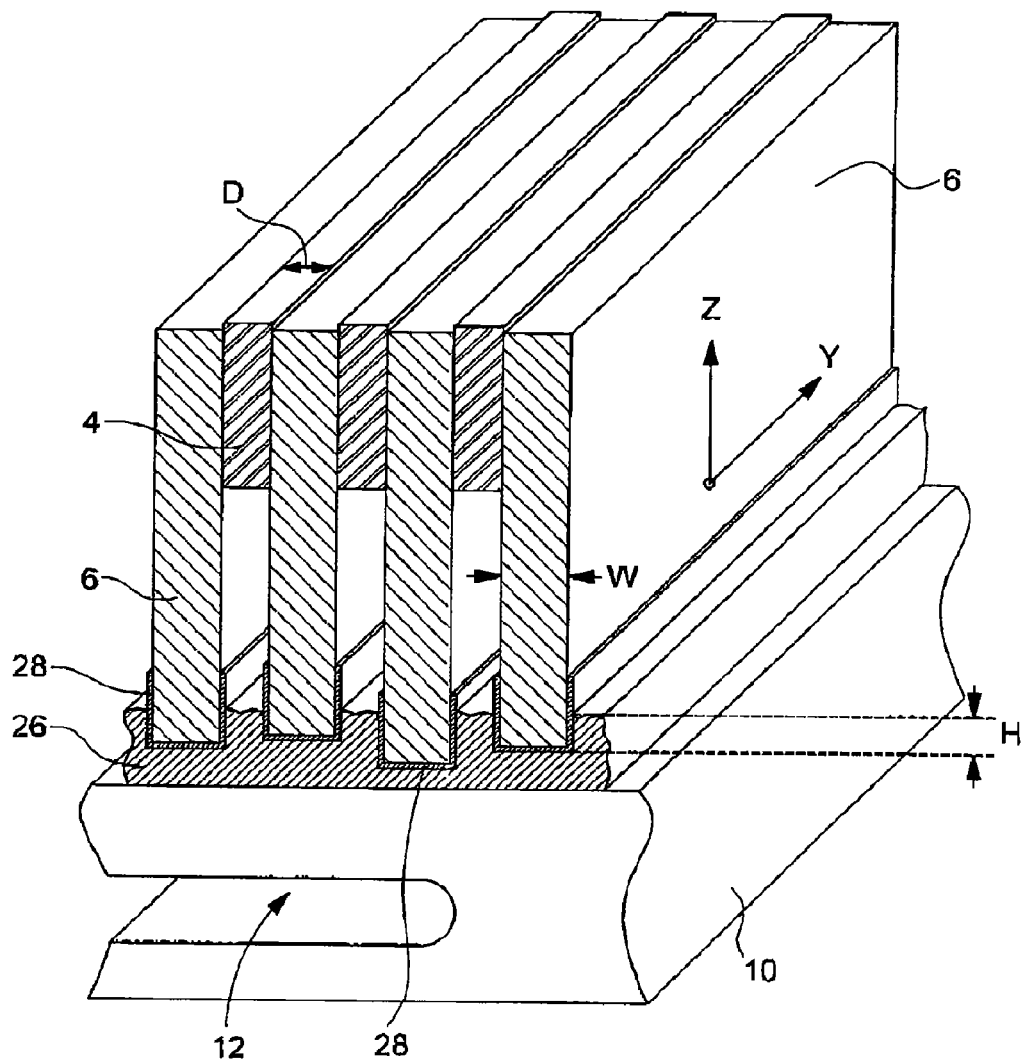
FIG. 3 shows partially a variant of the device of FIG. 2, which shows some advantages of the invention.

FIG. 3 shows partially in perspective a variant of the embodiment of FIG. 2, which allows certain advantages of the present invention to be seen. First of all, given that plates 6, coated with an insulating layer 28 on the lower parts thereof, are dipped over a certain distance in a relatively thick braze bath 26, for example of a thickness of 0.3 to 0.8 mm, it is possible to obtain plates of different heights, aligned at the top ends thereof, where the laser diodes are arranged. A machining tolerance of ±100 μm could, for example, be envisaged with these dimensions.

Next, given that the braze bath 26 forms a continuous layer, a variation in the width W of the plates or a variation in the width D of the diodes is not critical. Plate width W is for example comprised between 200 and 300 microns and diode width D is comprised between 100 and 150 microns. A machining tolerance for dimensions W and D of ±20 microns does not cause any problems for welding to the cooling body.

Finally, the present invention allows the heat transfer surface between each plate and the cooling body to be considerably increased. This can be demonstrated by a simple calculation. W is the width of one plate, H the mean penetration height of the plates in the braze bath and L the plate length along direction Y.

If L=10 mm and W=0.25 mm, the transfer surface in the prior art is $S1=2.5$ mm$^2$. With H=120 μm (0.12 mm), the additional lateral surface is equal to $2 \cdot L \cdot H + 2 \cdot W \cdot H$ the value of which is approximately 2.5 mm$^2$. Thus, in this case, the transfer surface $S2$=approximately 5 mm$^2$, namely the double of $S1$.

According to the invention, the height H1 of the insulating layer along the lateral walls of the plate can reach approximately 1 mm (H1=1 mm). Thus, with no risk, one can provide H=0.5 mm approximately. The lateral surface is in this latter case approximately 10 mm$^2$ and the transfer surface is thus five times greater than that of the prior art. Moreover, the heat transfer is further improved by the fact that it is possible to provide a thin insulating layer with a thickness of less than 20 microns. The evacuation efficiency of the heat generated by the diodes is thus greatly improved compared to the devices of the prior art described in the introduction to this description of the invention.

The invention claimed is:

1. A laser device formed by a stack of laser diodes, the laser device comprising:
    (a) a plurality of plates, wherein each plate is formed of a material that is electrically conductive and a good heat conductor; and
    (b) a plurality of laser diodes, wherein each laser diode is arranged on a plate,
    wherein the plates are arranged next to each other, and two adjacent plates are located on either side of each of the laser diodes, wherein the plates provide an electric connection between the plurality of laser diodes that allows an electric supply current to pass and also allows the heat generated by the diodes to be conveyed in a direction of a cooling body to which the plates are secured by a securing material, wherein each plate is provided with a separate electrically insulating layer at an end of each plate on a side or the cooling body, wherein each of the separate electrically insulating layers forms an interface between the securing material on the cooling body and a respective plate, wherein each of the separate electrically insulating layers covers a bottom face of an end of a respective plate and extends substantially as far as a first height along lateral faces of the respective plate, and wherein the securing material covers bottom faces of the separate electrically insulating layers and also along lateral faces of the separated electrically insulating layers over a second height less than the first height.

2. The laser device according to claim 1, wherein the securing material is a braze deposited in a continuous manner on the cooling body and thus transversely between the plates.

3. The laser device according to claim 1, wherein the separate electrically insulating layer is formed by a ceramic material deposited on each plate without the addition of a braze.

4. The laser device according to claim 3, wherein the separate electrically insulating layer is a thin layer with a thickness of approximately within a range of between 1 μm and 5 μm.

5. The device according to claim 3, wherein the electrically insulating layer is a sol-gel deposited layer.

6. The device according to claim 3, wherein the electrically insulating layer is selected from the group consisting of a physical vapour deposition layer and a chemical vapour deposition layer.

7. A laser device formed by a stack of laser diodes, the laser device comprising:
    (a) a plurality of plates, wherein heights of the plates are different, and wherein each plate is formed of a material that is electrically conductive and a good heat conductor; and
    (b) a plurality of laser diodes, wherein each laser diode is arranged on each plate,
    wherein the plates are arranged next to each other, and two adjacent plates are located on either side of one of the laser diodes, wherein the plates provide an electric connection between the plurality of laser diodes that allows an electric supply current to pass and also allows the heat generated by the diodes to be conveyed in a direction of a cooling body to which the plates are secured by a securing material, wherein each plate is provided with a separate electrically insulating layer at an end of each plate on a side of the cooling body, wherein each of the separate electrically insulating layers forms an interface between the securing material on the cooling body and a respective plate, wherein each of the separate electrically insulating layers covers a bottom face of an end of the respective plate and extends substantially as far as a first height along lateral faces of the respective plate, and wherein the securing material covers bottom faces of the separate electrically insulating layers and also along lateral faces of the separated electrically insulating layers over a second height less than the first height.

* * * * *